United States Patent [19]

Landis

[11] Patent Number: 4,709,300

[45] Date of Patent: Nov. 24, 1987

[54] JUMPER FOR A SEMICONDUCTOR ASSEMBLY

[75] Inventor: Richard C. Landis, Shelton, Conn.

[73] Assignee: ITT Gallium Arsenide Technology Center, a division of ITT Corporation, Roanoke, Va.

[21] Appl. No.: 859,962

[22] Filed: May 5, 1986

[51] Int. Cl.$^4$ .................................................. H01R 9/00
[52] U.S. Cl. .................................. 361/398; 361/408; 361/413; 439/513
[58] Field of Search ................................ 361/392–395, 361/398, 412, 413, 414, 408; 339/17 F, 29, 17 M, 17 LM, 19, 103 R, 103 M

[56] References Cited

U.S. PATENT DOCUMENTS 3,772,775  11/1973  Bonnke et al. ..................... 339/17 F
4,295,695  10/1981  Dodds ............................... 339/17 F Primary Examiner—A. D. Pellinen
Assistant Examiner—Todd E. DeBoer
Attorney, Agent, or Firm—Robert A. Walsh; Mary C. Werner

[57] ABSTRACT

A jumper for interconnecting a plurality of wafer scale assemblies includes a pair of grooves proximate the bending points thereof to relieve stresses introduced by bending forces.

11 Claims, 3 Drawing Figures

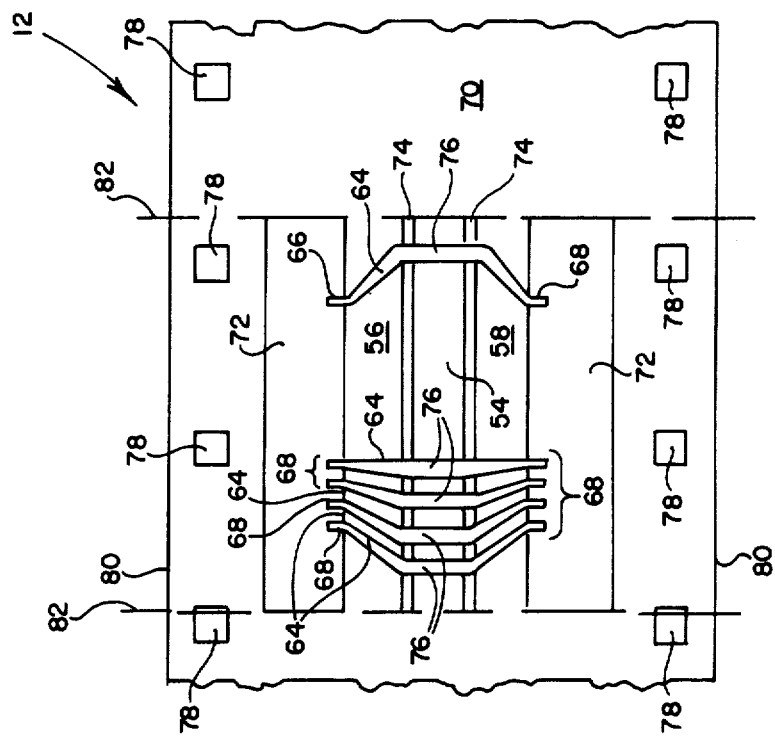
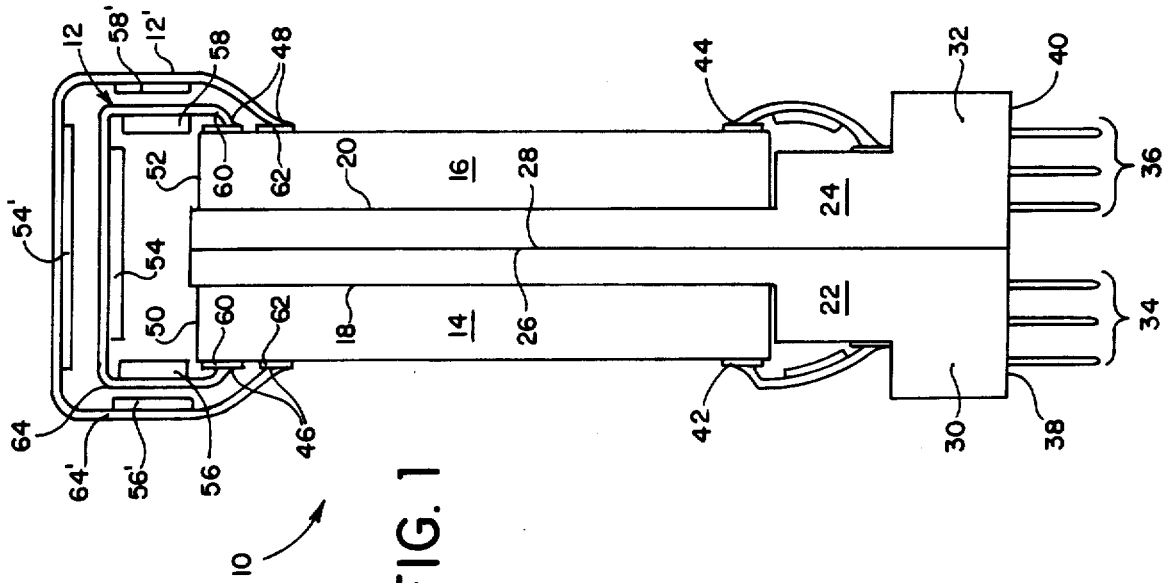

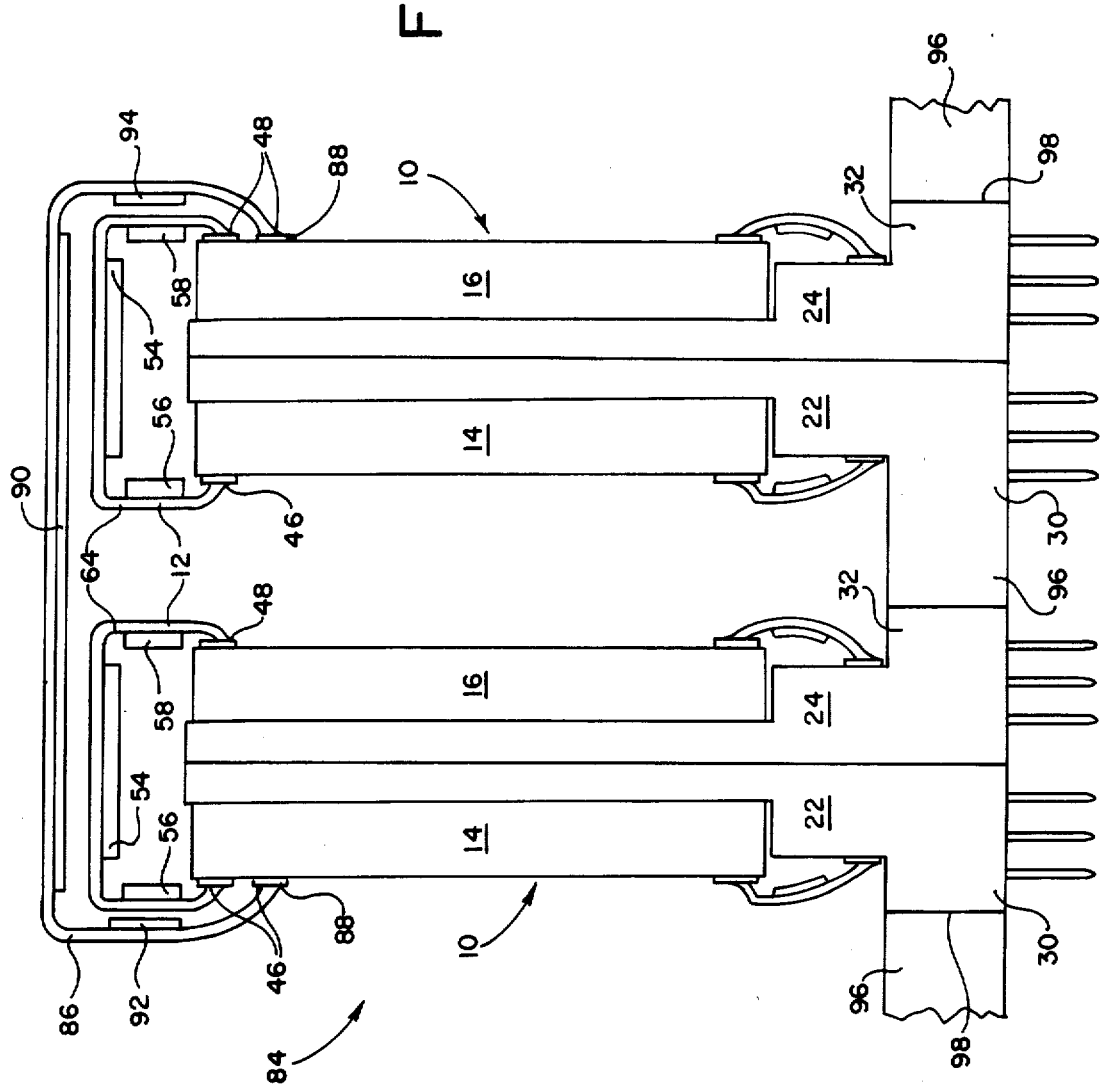

JUMPER FOR A SEMICONDUCTOR ASSEMBLY

CROSS-REFERENCE TO RELATED APPLICATIONS

This application is related to one, or more, of the following United States patent applications: Ser. No. 859,964, entitled PACKAGE FOR A SEMICONDUCTOR ASSEMBLY; Ser. No. 860,168, entitled HEADER FOR A WAFER SCALE ASSEMBLY; Ser. No. 859,942, entitled MULTILAYER CONNECTION FOR A SEMICONDUCTOR CHIP; Ser. No. 859,961, entitled SEMICONDUCTOR INTEGRATED DEVICE HAVING REDUNDANT TERMINALS FOR DISCRETE ELECTRICAL CONDUCTORS; Ser. No. 859,963, entitled MULTIPLE WAFER SCALE ASSEMBLY APPARATUS AND FIXTURE FOR USE DURING THE FABRICATION THEREOF; Ser. No. 859,940, entitled A DIRECT INTERCONNECTION FOR USE BETWEEN A SEMICONDUCTOR AND A PIN CONNECTION OR THE LIKE; Ser. No. 859,938, entitled INTERLAYER CONDUCTIVE CONNECTIONS AND METHOD FOR FORMING SAME and Ser. No. 860,151, entitled UNIVERSAL WAFER SCALE ASSEMBLY all filed on even date herewith and assigned to the assignee hereof.

BACKGROUND OF THE INVENTION

The present invention generally relates to a jumper for a semiconductor assembly and, in particular, relates to one such jumper having means for relieving stresses created therein during the use thereof.

The provision of electrically conductive jumpers in semiconductor assemblies has usually been constrained to substantially lateral, although possibly somewhat vertically displaced, interconnections. One reason for such a constraint is that in most semiconductor assemblies connections, for example, wire bonds, are formed of conductive material having relatively small cross-sectional areas. Such connections tend to be weakened when sharp bends are required along the length thereof. Further, most bonding machines, particularly those adapted for automated operation, are designed to form bonds in the plane perpendicular to the bonding heads thereof. As a result, to increase the speed of assembly, inter alia, conventional semiconductor assemblies are designed so that the bonding pads lie in substantially the same plane as the points to be connected thereto.

Another basis for such a constraint is, at least for semiconductor assemblies dissipating substantial quantities of power, that one surface of all the semiconductor components of the semiconductor assembly is usually attached to a heat sink. Consequently, the use of non-lateral jumpers between, for example, opposing surfaces of such an assembly has been unwarranted.

One particular vehicle that exhibits these constraints is the so-called wafer scale assembly. In general, a wafer scale assembly is a conglomeration of interconnected semiconductor chip devices and/or subassemblies mounted on one surface of a common substrate. The common substrate can be, for example, a semiconductor material, such as a silicon wafer, and usually includes electrically conductive interconnections formed on the one surface thereof. Typically, wafer scale assemblies allow many chips to be interconnected into a single operative device in a reliable fashion. That is, such a wafer scale assembly is considered more reliable than a fully integrated identical device formed by conventional semiconductor integrated circuit fabrication techniques. One reason for the increased reliability is that the individual chips can be tested prior to affixing them to the wafer scale assembly substrate. Such wafer scale assemblies have numerous advantages in addition to the increased reliability thereof. For example, wafer scale assemblies generally exhibit an excellent thermal matching between the substrate and the chips/subassemblies affixed thereto and consequently, stresses resulting from thermal expansions and contractions are less destructive. Further, wafer scale assemblies offer high chip density circuits and arrangements similar to that of chip size integrated devices. In addition, wafer scale assemblies have a relatively low cost per function as well as the ability to mix different types of integrated circuits, i.e., MOS and BIPOLAR chips, on the same silicon substrate.

Currently, many semiconductor assemblies include a ceramic substrate having a plurality of pins extending perpendicular from a major surface thereof with the assembly mounted to the opposing major surface of the ceramic substrate.

However, in an environment where the surface generating the heat to be dissipated is the surface exposed to the primary coolant it becomes possible to mount pairs of semiconductor assemblies back-to-back. One particular cooling package is described and discussed in U.S. patent application Ser. No. 859,964 filed on even data herewith and entitled PACKAGE FOR A SEMICONDUCTOR ASSEMBLY. A header for such a semiconductor assembly that is designed, inter alia, to enhance the ability to mount, for example, two wafer scale assemblies in back-to-back fashion is described and discussed in U.S. patent application Ser. No. 859,942 filed on even date herewith and entitled HEADER FOR A WAFER SCALE ASSEMBLY. Both of the above referenced applications are assigned to the assignee hereof and incorporated herein by reference.

Consequently, since semiconductor assemblies, such as wafer scale assemblies, can now be practically connected in a back-to-back fashion, it has become highly desireable to provide a jumper that is reliable and particularly adapted for connecting to pluralities of pads on opposing surfaces of such a semiconductor assembly.

SUMMARY OF THE INVENTION

Accordingly, it is one object of the present invention to provide a flexible jumper for a semiconductor assembly having means for relieving stresses therewithin.

This object is accomplished, at least in part, by providing a flexible jumper having a plurality of conductive strips with means for supporting the strips and simultaneously maintaining a fixed distance therebetween and means for relieving stresses introduced during bending of the conductive strips.

Other objects and advantages will become apparent to those skilled in the art from the following detailed description read in conjunction with the appended claims and the drawings attached hereto.

BRIEF DESCRIPTION OF THE DRAWINGS

FIG. 1 is a side view of a semiconductor assembly, not drawn to scale, including jumpers embodying the principles of the present invention;

FIG. 2 is a plan view of the jumper shown in FIG. 1 prior to attachment to the semiconductor assembly; and FIG. 3 is a side view, not drawn to scale, of another semiconductor assembly employing jumpers embodying the principles of the present invention.

DETAILED DESCRIPTION OF THE INVENTION

A semiconductor assembly, generally shown at 10 in FIG. 1, is an exemplary environment wherein a jumper, generally indicated at 12 and embodying the principles of the present invention, is particularly useful.

As shown in the embodiment of FIG. 1, the semiconductor assembly 10 includes first and second wafer scale assemblies, 14 and 16, respectively. Each wafer scale assembly, 14 and 16, is affixed to an assembly mounting surface, 18 and 20, respectively, of first and second headers, 22 and 24, respectively. Each of the headers, 22 and 24, includes a back surface, 26 and 28, respectivly. In this embodiment of the semiconductor assembly 10, the headers, 22 and 24, are oriented so that the back surfaces, 26 and 28, respectively, thereof are proximate each other, i.e., a back-to-back fashion. In addition, as shown in FIG. 1, each of the headers, 22 and 24, has a plug portion, 30 and 32, respectively, associated therewith. Each plug portion, 30 and 32, respectively, having a plurality of pins, 34 and 36, respectively, extending from one surface, 38 and 40, respectively, thereof.

In addition, each wafer scale assembly, 14 and 16, includes a first plurality of bonding pads, 42 and 44, respectively, proximate the plug portion, 30 and 32, respectively, of the respective header, 22 and 24. In addition, each wafer scale assembly, 14 and 16, includes a second plurality of bonding pads, 46 and 48, respectively, proximate an edge, 50 and 52, respectively, thereof distal the plug portions, 30 and 32, respectively, of the headers, 22 and 24.

In one preferred embodiment, shown in FIG. 1, the jumper 12 is connected between the second plurality of bonding pads 46 of the first wafer scale assembly 14 and the second plurality of bonding pads 48 of the second wafer scale assembly 16. The jumper 12, in ths embodiment, spans the edges, 50 and 52 of the headers, 22 and 24, respectively.

Further, the jumper 12 includes a central support member 54 and first and second side support members, 56 and 58, respectively. Preferably, each side support member, 56 and 58, is spaced apart from the central support member 54 thereby providing means for relieving stresses introduced into the jumper 12 by the bending thereof. Hence, the mechanical forces operating to straighten the jumper 12 and working to break the bond between the jumper 12 and the bonding pads, 46 and 48, are minimized.

In one arrangement, for example, wherein each second plurality of bonding pads, 46 and 48, are arranged in an outer row 60 and an inner row 62, respectively, more than one jumper 12 can be employed. That is, as shown in FIG. 1, a jumper 12' can be used to interconnect between the inner rows 62 of bonding pads, 46 and 48, and another jumper 12 can be used to interconnect between the outer rows 60 of bonding pads, 46 and 48. The jumper 12' also includes a central support member 54' and first and second side support members, 56' and 58', respectively. Advantageously, each support member, 54, 54', 56, 56', 58 and 58' is, as more fully discussed below, formed from an electrically insulating material and hence, provides electrical isolation between the jumpers 12 and 12'.

In one preferred embodiment, the jumper 12, shown more clearly in FIG. 2, includes a plurality of electrically conductive strips 64 each having first and second end portions, 66 and 68, respectively.

The jumper 12 can be readily fabricated by first affixing a conductive material to, for example, a plastic film 70. Subsequent to a conventional etching procedure to form the conductive strips 64 a plurality of windows 72 are formed to expose the first and second end portions, 66 and 68, respectively, therethrough. In addition to the windows 72, a pair of grooves 74 are formed by, for example, conventional dielectric etching processes. The film 70 between the grooves 74 essentially defines the central support member 54 and is preferably sized to be about equal to the width of the semiconductor assembly 10 such that the resultant bends in the jumper 12 do not exceed 90° when the jumper 12 is attached. The film 70 between each window 72 and the groove 74 proximate thereto defines the side support members, 56 and 58.

The conductive strips 64 are preferably formed such that each strip 64 has a uniform central portion 76 across the central support member 54. Such a comparatively wider central portion 76 of the strip 64, compared to the width of the end portions, 66 and 68, that are bonded to each of the wafer scale assemblies, 14 and 16, provides additional strength to the individual strips 64 of the jumper 12 when bent. Typically, the distance between opposing pluralities of pads, 46 and 48, of the first and second wafer scale assemblies, 14 and 16, respectively, is on the order of about 30 mils. In one instance wherein the plastic film 70 is about 35 millimeters wide the first and second windows 72 exposing each of the end portions, 66 and 68, is on the order of 1 millimeter wide by 1.2 to 2.5 centimeters long. In addition, the plastic film 70 typically has a thickness on the order of about 0.1 millimeters. Further, the first and second side support members, 56 and 58, respectively, are preferably about 0.6 millimeters wide and spaced apart from the central support member 54 by about 0.2 millimeters. Further, in order to enhance the automated feeding of the jumper 12 during fabrication of the assembly 10 the film 70 is provided with regularly spaced sprocket holes 78 along the edges 80 thereof. Subsequent to the attachment of the jumper 12, the film 70 is severed along break lines 82 to leave the jumper 12 in place and allow the winding of the film 70 to appropriately position the next jumper 12. One particular fixture useful in assembling the assembly 10 is more fully described and discussed in U.S. patent application Ser. No. 859,963, entitled MULTIPLE WAFER SCALE ASSEMBLY APPARATUS AND FIXTURE FOR USE DURING THE FABRICATION THEREOF filed on even data herewith. This application is assigned to the assignee hereof and incorporated herein by reference.

In another embodiment, demonstrative of the versatility of a jumper embodying the principles of the present invention, a compound assembly 84, for example, is shown in FIG. 3. Therein, a pair of back-to-back assemblies 10 are interconnected by use of a jumper 86 embodying the principles of the present invention. For the convenience of the reader, all elements previously described are identified with the saame indicia as originally used. In such a compound assembly 84, each assembly 10 includes as part of the second pluralities of bonding pads, 46 and 48, an interconnection row of bonding pads 88. The jumper 86 connects between the interconnection rows and bonding pads 88 and includes a central support member 90 and first and second side support members, 92 and 94, respectively. In the embodiment shown in FIG. 3, the central support member 90 of the jumper 86 spans substantially the entire length of the inner jumpers 12. Thus, the jumpers 12 are electrically isolated from the jumper 86 interconnecting the pair of assemblies 10. The compound assembly 84 can be housed, for example, in a package having a base member 96 having openings 98 therein for receiving the headers, 22 and 24.

Although the present invention has been described with respect to particular embodiments, other arrangements and configurations may be developed that, nevertheless, do not depart from the spirit and scope of the present invention. Hence, the present invention is deemed limited only by the appended claims and the reasonable interpretation thereof.

What is claimed is:

1. A jumper interconnecting a first set of connecting pads disposed on one surface of a semiconductor assembly with a second set of connecting pads disposed on an opposite surface of said semiconductor assembly, said jumper comprising a plurality of electrically conductive strips arranged one behind the other in a row, each of said strips having a first end portion connected to a corresponding one of said pads of said first set of connecting pads, a second end portion connected to a corresponding one of said pads of said second set of connecting pads and a central portion connected to said first end portion by a first bend and to said second end portion by a second bend such that said central portion spans at least a substantial portion of said semiconductor assembly, said first and second end portions and said central portion having an outer surface facing away from said semiconductor assembly and an inner surface facing toward said semiconductor assembly; a central support member attached to said inner surface of said central portion of each of said conductive strips; a first side support member attached to said inner surface of said first end portion of each of said conductive strips between said connecting pads of said first set of connecting pads and said first bend in said conductive strips, said first side support member being spaced from said central support member in the vicinity of each said first bend to thereby relieve stresses produced by the bending of each of said conductive strips to form said first bend therein, whereby the mechanical forces operating to straighten said conductive strips and to separate them from said first set of connecting pads are reduced; and a second side support member attached to said inner surface of said second end portion of each of said conductive strips between said connecting pads of said second set of connecting pads and said second bend in said conductive strips, said second side support member being spaced from said central support member in the vicinity of each said second bend to thereby relieve stresses produced by the bending of each of said conductive strips to form said second bend therein, whereby the mechanical forces operating to straighten said conductive strips and to separate them from said second set of connecting pads are reduced.

2. A jumper according to claim 1, wherein said central support member cooperates with said first and second side support members to retain said conductive strips in a predetermined pattern.

3. A jumper according to claim 1, wherein said jumper spans said semiconductor assembly.

4. A jumper according to claim 3, wherein said central support member extends from said first bend in said conductive strips to said second bend in said conductive strips.

5. A jumper according to claim 1, wherein said central support member and said first and second side support members include a dielectric film.

6. A jumper according to claim 1, wherein said central portion of each of said conductive strips has a substantially uniform width.

7. A jumper according to claim 6, wherein said first and second side support members have a width which is less than said width of said central portion of each of said conductive strips.

8. A jumper according to claim 1, wherein said semiconductor assembly includes a pair of semiconductor devices arranged in back-to-back fashion.

9. A jumper according to claim 8, wherein each of said semiconductor devices is a wafer scale assembly.

10. A jumper according to claim 1, wherein said central portion of each of said conductive strips extends substantially transversely across said central support member.

11. A jumper according to claim 10, wherein said conductive strips are attached to said central support member such that the distance between each pair of adjacent strips is fixed.

* * * * *